United States Patent [19]
Ramm et al.

[11] Patent Number: 5,568,558
[45] Date of Patent: Oct. 22, 1996

[54] ADAPTIVE NOISE CANCELLATION DEVICE

[75] Inventors: Dov Ramm, Menashe; Dan Chazan, Haifa, both of Israel

[73] Assignee: International Business Machines Corporation, Armonk, N.Y.

[21] Appl. No.: 164,912

[22] Filed: Dec. 3, 1993

[30] Foreign Application Priority Data

Dec. 2, 1992 [GB] United Kingdom ............. 9225212

[51] Int. Cl.⁶ ................................ H04B 15/00
[52] U.S. Cl. ............................ 381/94; 381/71
[58] Field of Search ................. 381/71, 94; 364/574

[56] References Cited

U.S. PATENT DOCUMENTS

| | | | |
|---|---|---|---|
| 5,386,372 | 1/1995 | Kobayashi | 364/574 |
| 5,414,733 | 5/1995 | Turner | 375/233 |
| 5,416,844 | 5/1995 | Nakaji | 381/71 |

*Primary Examiner*—Edward L. Coles, Sr.
*Assistant Examiner*—Jerome Grant, II
*Attorney, Agent, or Firm*—Robert M. Trepp

[57] ABSTRACT

An adaptive noise cancellation device comprises: convolution logic (10) for convolving the signal from a reference input (x) with a discretized L-tap filter to form a filtered reference signal; and logic (20) for subtracting the filtered reference signal from a signal input to form an output signal; logic for generating the filter taps as a linear combination of N basis functions each having a corresponding coefficient $C_k$; and logic for repeatedly determining the coefficients $C_k$ which minimize the power in the output signal (z), characterized in that N is less than the number of filter taps L and the basis functions have respective values over a portion of finite width, outside of which portion the functions are substantially zero, both in the frequency and time domains, in an embodiment they are gaussian. A full-duplex speakerphone is disclosed including such a noise cancellation device.

15 Claims, 1 Drawing Sheet

ADAPTIVE NOISE CANCELLATION DEVICE

FIELD OF THE INVENTION

This invention relates to adaptive noise cancellation devices and more particularly to the use of adaptive noise concellation devices as howling cancellers for full duplex speakerphones.

BACKGROUND OF THE INVENTION

It is common practice to use adaptive noise cancellation devices in the transmission of intelligible speech from an environment with considerable acoustic noise, such as an aircraft cockpit, a car etc., utilizing as a reference signal the signal from an additional microphone, located sufficiently far from the speaker to be insensitive to the speech of the speaker and as close as possible to the noise source. Adaptive noise cancellation devices are also used in full-duplex speakerphone applications to prevent howling resulting from the feedback path between speaker and microphone of the speakerphone device.

Various techniques for adaptive noise cancelling are known, some of these are described in a paper by B. Widrow et al, "Adaptive Noise Cancelling—Principles and Application of the LMS adaptive filter", Proc IEEE, Vol 63, No 12, Dec 1975, pp 1692–1716, and in a paper by M. R. Sambur, "Adaptive Noise Cancelling for Speech Signals", IEEE trans. ASSP, vol 26, 1977, pp 419–423.

An adaptive noise canceller first produces an estimate of the characteristics of the transformation from the reference noise signal to the noise component of the signal at the main microphone. This transformation actually depends on two acoustic coupling paths: the first between the noise source to the additional microphone, the second between the noise source to the main microphone. Then the reference noise signal is used to model the noisy signal component at the main microphone. This noise component is subtracted from the actual microphone signal. In the absence of the speaker signal and assuming that the transformation is exactly identified, the difference between the actual main microphone input and the estimated noise at the adaptive filter output would be zero. In the presence of the speaker signal this difference signal contains mainly the signal from the speaker.

The filter characteristics are dynamically changed for optimum removal of the noise signal. The two acoustic paths, which define the transformation between the additional and the main microphone are generally nonstationary. The adaptation rate has to be sufficiently high to adaptively track changes in the impulse responses of these paths due to the movement of people or objects in the room, the movement of the noise source or the change in the noise characteristics.

Adaptive filters usually employ the well established "LMS algorithm", which is known also by the name "stochastic gradients", see, for example, Widrow B, et al "Stationary and Nonstationary Learning Characteristics of the LMS Adaptive Filter", Proc IEEE, August 1976, Vol 64, No 8, PP 1151–1162.

According to the LMS algorithm, the output of the adaptive filter is required to be as small as possible in the sense of least-mean-square error, ie the output power is minimized. The LMS algorithm updates N unknown filter coefficients each input sample and produces an approximately optimal solution in O(N) computations. The LMS algorithm works best when the reference signal is a white noise signal. However, for actual signals which differ from a white noise, and are non-stationary, the convergence of the LMS method is very poor.

The required filter length, ie the number of taps N, is determined by the length of impulse responses of the acoustic leakage paths, that is by the reverberation times of the room. Typical reverberation time of most rooms is less than 400 msec. The adaptive filter length must therefore be about 100 to 200 msec, ie in the range of 1000 to 2000 taps for a common choice of sampling frequency of 8 KHz. Not counting the filtering operation itself, the computational requirements for adaptive LMS filter implementation are therefore at least in the range of 16 to 32 million instructions per second—a very substantial amount of computing power.

Another approach to the problem of adaptive noise cancellation is known as the sub-band acoustic echo canceller (SBAEC), see for example a paper by Andre Gilloire, "Experiments with Sub-Band Acoustic Echo Cancellers for Teleconferencing", Proc of IEEE ICASSP 87, April 1987, pp 2141–2144. These have advantages over the standard LMS method both in adaptation rate and in computational complexity. They do, however, have a residual error due to channel interdependence, which has not been taken into account in the adaptation scheme, and this limits the number of channels and therefore the computational improvement which may be obtained.

SUMMARY OF THE INVENTION

This invention provides an adaptive noise cancellation device having a signal input, a reference input and a signal output, the device comprising: convolution logic for convolving the signal from the reference input with a discretised L-tap filter to form a filtered reference signal; and logic for subtracting the filtered reference signal from the signal input to form the output signal; logic for generating the filter taps as a linear combination of N basis functions each having a corresponding coefficient $C_k$; and logic for repeatedly determining the coefficients $C_k$ which minimize the power in the output signal, characterized in that N is less than the number of filter taps L and the basis functions have a portion of finite width, outside of which portion the functions are substantially zero, both in the frequency and time domains.

The LMS formulation forms the basis for the approach of this invention. However, unlike the prior art, the filter is represented as a sum of N basis functions, where N is less than the filter length. This is a generalization of the SBAEC. In the latter, the signal is prefiltered by several band filters. However, for each sub-band a conventional LMS algorithm is applied to adapt a number of filter coefficients in each band, the interdependence of the different bands being neglected. By contrast, in the approach of this invention there are as many "bands" as degrees of freedom. In each sub-band there is only one filter coefficient to be defined and interdependence of adjacent bands is systematically accounted for.

Preferably the basis functions have a small time-bandwidth product. That means that the basis functions have to be well concentrated in the time domain, ie their time-width should be as small as possible and simultaneously these functions have to have a bandwidth in the frequency domain as small as possible.

In practice what this means is that the basis functions are such that within the desired accuracy, both the basis functions and their Fourier transforms may be approximated by narrow functions with finite supports. The use of such basis functions will mean that the filter which is obtained by combining them, will in general be non-causal, resulting in some additional delay. However, by a judicious choice of parameters this delay can be made equal to only a small portion of the filter length, and small compared to other delays in the system.

In one embodiment, the basis functions are generated by an equation of the following form, $$w_k(t) = W(t)\exp(jk(\Delta\omega)t) \quad (1)$$

such as are used in a discrete Fourier transform. Here, $j=\sqrt{-1}$, k is an index which runs from $-N/2$ to $(N/2)-1$, and $\Delta\omega$ is the step in the frequency domain. In this form the requirement of small time-bandwidth product is applied actually only to the window function $w(t)$.

The requirement that the basis functions have small time bandwidth product results in negligible interdependence between basis functions with indices i and k where |i–k| is larger than about 3. Therefore the system of equations for filter coefficients, which is obtained by a differentiation of the expression for mean-square error, has a sparse matrix, in which only diagonals near the main diagonal differ from zero. Such system can be solved efficiently with $O(N)$ computations. Since a computation of the system matrix itself requires a calculation of correlation functions, which is performed in $O(N\log N)$ operations, the whole filter adaptation can be made in $O(N\log N)$ operations per computational block, yielding a new accurate update of the filter coefficients per block, assuming that the block length is some small integer multiple of the filter length.

BRIEF DESCRIPTION OF THE DRAWING

These and other features, objects, and advantages of the present invention will become apparent upon a consideration of the following detailed description of the invention when read in conjunction with the drawing in which.

DESCRIPTION OF THE PREFERRED EMBODIMENT

Figure 1:
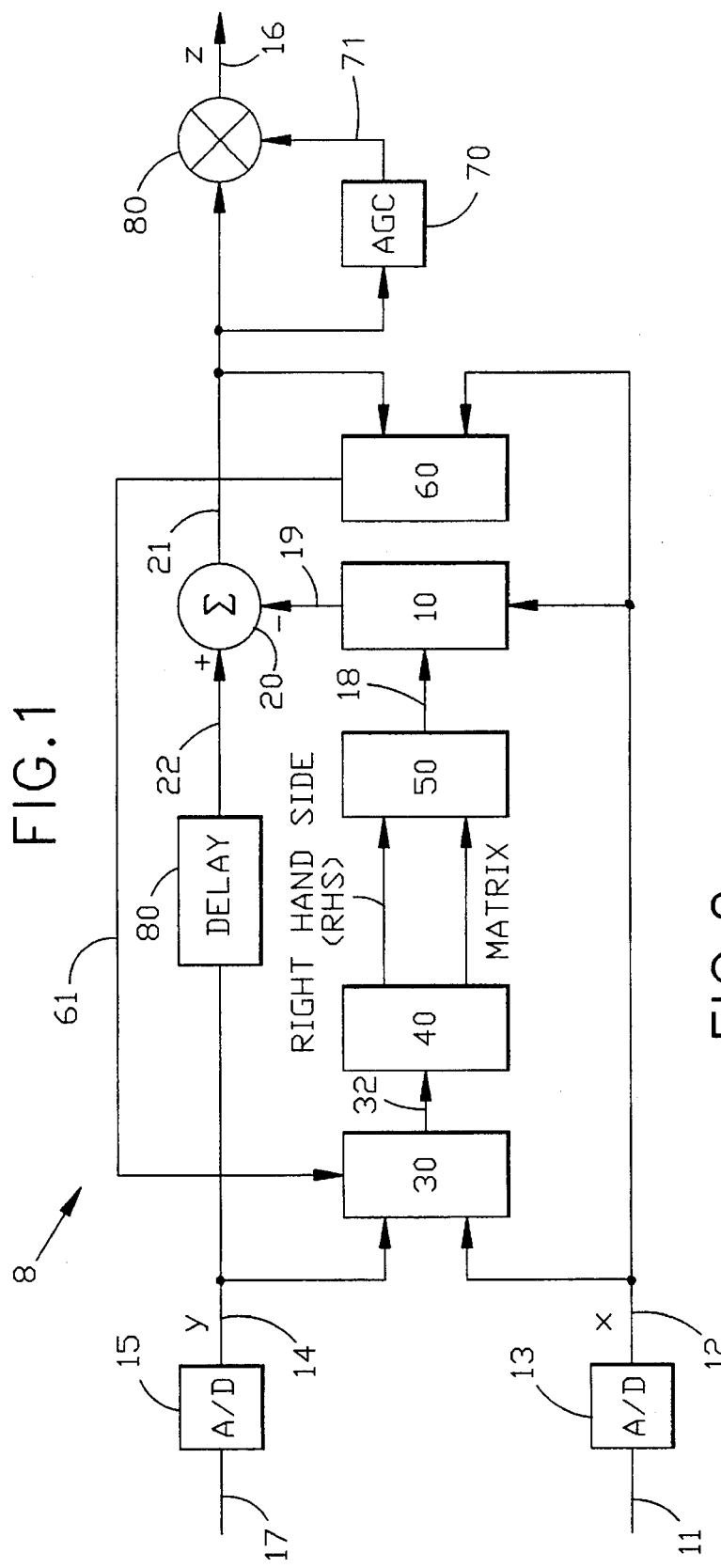
FIG. 1. is a schematic block diagram of the adaptive noise cancellation device of the embodiment of the invention.

A block diagram of the adaptive noise cancellation device 8 is shown in FIG. 1. The device accepts as input the audio signals reference input signal x on lead 12 and main input signal y on lead 14, and produces as output the signal z on lead 16. The device includes the following elements: the convolution logic 10, which convolves the reference signal x with the current filter coefficients supplied over lead 18; the subtractor 20, which subtracts the convolver output on lead 19 from the main input signal y (appropriately delayed) on lead 22; the correlation logic 30, which computes the autocorrelation function of the reference signal x and the cross-correlation function between the reference and the main input signal y; the equation set logic 40, which computes, from these correlation functions on lead 32, the coefficients of the system of linear equations for filter coefficients; the equation solver 50, which solves the system of linear equations; and the control logic 60, which computes short time power or amplitude estimates for the reference signal x on lead 12 and the subtractor 20 output signal on lead 21 and determines a control parameter on lead 61 for the correlation logic block 30. Finally, the automatic gain control (AGC) block 70 multiplies the subtractor 20 output on lead 21 by slowly changing gain on lead 71 at the multiplier 80 to provide the output of multiplier 80 on lead 16 being the output of device 8.

In this embodiment of the invention the logical elements are implemented by a suitably programmed combination of an IBM Personal System/2 personal computer manufactured by International Business Machines Corporation, Armonk, N.Y., a plug-in accelerator card which includes an i860 processor chip manufactured by Intel Corporation, Santa Clara, Calif., and an IBM Audio Capture and Playback card for inputting and outputting the signals (IBM and Personal System/2 are trademarks of International Business Machines Corporation). Using this arrangement it has proved possible to attain real-time performance with filters of length 1.024.

However, the invention may equally be implemented by a suitably programmed general purpose Digital Signal Processor which performs real time processing of incoming digital signals, or by using special purpose hardware. It will be understood that the blocks indicated schematically in FIG. 1 and the above description may in practice be intermixed. For example, the convolution logic may be implemented in the frequency domain and may use the same Fourier transform data and algorithms, as those which are used by correlation logic 30.

The reference signal x, if analog, is fed to device 8 over lead 11 through a suitable analog/digital (A/D) converter 13. The input signal y, if analog, is connected over lead 17 through another A/D converter 15 to device 8.

The convolution logic 10 generates a convolution of the reference signal x, with a filter response function Q which simulates the acoustic path between the reference noise source and the main signal input. The output of the convolution logic 10 on lead 19 simulates the interfering noise signal entering the microphone and appearing on lead 14.

According to the LMS (Least-mean-square) formulation, which forms the basis of the present approach, the output of the adaptive filter 8, is required to be as small as possible in the sense of the least-mean-square error. Since the interfering noise and the desired signal are assumed to be uncorrelated signals, the minimization problem is to determine Q such that $\{|y-Qx|\}$, ie the output power, is minimized, where y on lead 14 is the primary signal at the main microphone and Qx is the output of the filter Q given the input x on lead 12 to the filter, convolution logic 10. The filter output Qx on lead 19 is equal to $q(t) \otimes x$, where $\otimes$ denotes a convolution operation and $q(t)$ is a filter impulse response.

Convolution logic 10 or filter Q is represented as a sum of N basis functions, with unknown coefficients, $C_k$. The filter has the form:

$$q(t) = \sum_{k=-\frac{n}{2}}^{\frac{n}{2}-1} C_k \phi_k(t), \quad \Phi_k(t) = w(t)\{\exp(jk(\Delta\omega)t)\}, \quad (2)$$

where $\Delta\omega$ is a frequency step, t is time and $w(t)$ is a window function.

In the frequency domain the Fourier transforms, $\Phi_k$, of the basis functions, $\phi_k(t)$, are shifted copies of the Fourier transform $W(\omega)$ of the window function $w(t)$;

$$\Phi_k(\omega) = W(\omega - k\Delta\omega) = \Phi_0(\omega - k\Delta\omega) \quad (3)$$

Hence, the filter frequency response is found to be a combination of shifted window responses:

$$Q(\omega) = \sum_{k=-\frac{N}{2}}^{\frac{N}{2}-1} C_k W(\omega - k\Delta\omega) \quad (4)$$

The solution of the minimization problem leads to a set of N linear equations for $C_k$:

$$\sum_{k=-\frac{N}{2}}^{\frac{N}{2}-1} a_{ik} C_k = r_i \quad i = -\frac{N}{2}, \ldots, \frac{N}{2}-1, \quad (5)$$

with the system coefficients $a_{ik}$, and the right-hand side $r_k$. If $a_{ik}$ and $r_i$ can be determined, then $C_k$ can be calculated.

In the general case, the system coefficients $a_{ik}$ can be expressed as follows;

$$a_{ik} = \int_{-\infty}^{\infty} \Phi^*_i(\omega) \Phi_k(\omega) X^*(\omega) X(\omega) d(\omega) \quad (6)$$

$$= \int_{-\infty}^{\infty} X^*(\omega) X(\omega) W^*(\omega - i\Delta\omega) W(\omega - k\Delta\omega) d\omega \quad (7)$$

where $X(\omega)$ and $Y(\omega)$ are the Fourier transforms of x and y respectively and the right-hand-side coefficients $r_i$ can be expressed as follows.

$$r_i = \int_{-\infty}^{\infty} \Phi^*_i(\omega) X^*(\omega) Y(\omega) d\omega \quad (8)$$

$$= \int_{-\infty}^{\infty} X^*(\omega) Y(\omega) W^*(\omega - i\Delta\omega) d\omega, \quad (9)$$

By denoting a combination of window responses as:

$$K(\omega),\mu) = W^*(\omega - \mu\Delta\omega) W(\omega + \mu\Delta\omega) \quad (10)$$

and correspondingly an auxiliary function in the time domain:

$$k(t,\mu) = F^{-1}[K(\omega,\mu)], \quad (11)$$

the coefficients $a_{ik}$ and q can be transformed:

$$a_{ik} = G_{xx}\left(\frac{i+k}{2}\Delta\omega, \frac{i-k}{2}\right) \quad (12)$$

$$G_{xx}(\omega,\mu) = F[R_{xx}(\tau)k(\tau,\mu)]$$

and $$r_i = G_{xy}(i\Delta\omega) \quad G_{xy} = F[R_{xy}(\tau)W(\tau)], \quad (13)$$

where $R_{xx}$ is the auto-correlation of the reference signal x and $R_{xy}$ is a function of the cross-correlation between the microphone output y and the reference x.

Thus $a_{ik}$ and $r_i$ and the unknown coefficients, $C_k$, in the filter response function can be determined from auto-correlations and cross-correlations of the input signals. The filter can then be computed by solving equation (5) which minimizes the noise interference in the output, z.

The computation of the filter coefficients involves the correlation logic 30, the equation set logic 40 and the equation solver 50. The correlation block 30 updates current auto- and cross-correlation functions for further analysis, the equation set block 40 uses the updated correlations for setting coefficients of the system of equations, and the equation solver block 50 computes the unknown coefficients.

The window function, w(t), which is used to generate the basis functions in equation (2) is required to have a small time-bandwidth product. This results in negligible interdependence between basis functions with indices i and k, where |i−k| is larger than about 3, where i and k are complex exponent indices. Thus the system of equations for filter coefficients has a sparse matrix, in which only several, D, diagonals above and below the main diagonal differ from zero. Such a system can be solved with O(N) computations. Since a computation of the system matrix itself requires a calculation of correlation functions, which is performed in O(NlogN) operations, the whole filter adaptation can be made in O(NlogN) operations per computational block, yielding a new accurate update of the filter coefficients per block. Generally the block length should be some small multiple of the filter length, L and the filter length, L, is of the order of a few N, where N is the number of degrees of freedom.

The correlation block subdivides the two signals: the reference x and the main input y, into frames of constant length that are equal to the filter length, L. Odd segments are padded by L zeros on the left and even segments are padded by L zeros on the right.

The Fourier transforms $F_{xx}$, $F_{xy}$ and $F_{yx}$ of the three one-sided correlations $R_{xx}$, $R_{xy}$ and $R_{yx}$ all with length L, the lag m being in the range $0 \leq m \leq L-1$ are initialized to zero. The Fourier transforms of the padded segments are then used to update the Fourier transforms $F_{xx}$, $F_{xy}$ and $F_{yx}$ as follows;

$$F_{xx} = \alpha^2 F_{xx} + \alpha X^*_{I-1} X_I + X^*_I X_I$$

$$F_{xy} = \alpha^2 F_{xy} + \alpha X^*_{I-1} Y_I + X^*_I Y_I$$

$$F_{yx} = \alpha^2 F_{yx} + \alpha X^*_{I-1} Y_I + X^*_I Y_I \quad (14)$$

where $X_{I-1}$ and $Y_{I-1}$ are the Fast Fourier Transforms (FFTs) of the previous segment and $X_I$ and $Y_I$ are the FFTs of the current segment. The "forgetting factor", $\alpha$, is a real coefficient in the range $0 \leq \alpha \leq 1$. Its value is determined by the control logic 60.

The output of correlation logic 30 on lead 32 are three Fourier transforms $F_{xx}$, $F_{xy}$ and $F_{yx}$, each containing 2L complex numbers.

The equation set block is activated every few frames. It consists of a lag domain correlator, a matrix computation block and a right-hand-side computation block.

The lag domain correlator computes the auto-correlation Rxx and the cross-correlation $R_{xy}$ in the lag domain (−(L−1) ≤ 0 ≤ L−1) by using the IFFT (Inverse Fast Fourier Transform) on the outputs $F_{xx}$, $F_{xy}$ and $F_{yx}$ of the correlation block. The first L numbers out of each 2L are kept. The results are arranged into the auto-correlation, $R_{xx}$, whose values at negative lags are copied from values of positive lags, since $R_{xx}$ is symmetric and the cross-correlation, $R_{xy}$, whose values at positive lags are taken as the first L numbers of IFFT of $F_{xy}$ and values at negative lags are taken as the first L numbers of IFFT of $F_{yx}$.

The cross-correlation, $R_{xy}$, in the range −(L−1) to L−1, are fed into the right-hand-side computation block. The computation of the $r_i$ is based on equation 13 as follows.

The cross-correlation data are multiplied by a sampled window function, and are then padded by zeros to obtain 2L numbers. They are then ordered as follows:

$R_{xy}(0), R_{xy}(1), \ldots, R_{xy}(L-1), 0, R_{xy}(-(L-1)), \ldots, R_{xy}(-1)$ The data are transformed to the frequency domain using FFT and the results are decimated by (L/N):1, producing N complex numbers $r_i$.

The auto-correlation, $R_{xx}$, in the range $-(L-1)$ to $L-1$, are fed into the matrix computation block. The computation of the $a_{ij}$ is based on equation 12 as follows.

The auto-correlation data are multiplied by precomputed samples of one of several auxiliary functions, $k(\tau,\mu)$, which are computed from the window function, for $\mu=0,1/2,1,\ldots,D/2$, where D is the number of diagonals above (and correspondingly below) the main diagonal which differ from zero. The window function w(t) and the frequency step $\Delta\omega$ could be chosen so that D was small.

The D results are padded by a zero in order to obtain 2L numbers for each value of They are then ordered as in the $R_{xy}$ case. The data are transformed to the frequency domain using FFT for each $\mu$.

The FFT results are decimated by (L/2N):1, yielding 2N real numbers for each $\mu$. The results for $\mu=0$ are used to fill the main diagonal of the system matrix. The result for $\mu=\frac{1}{2}$ are used to fill the diagonal just above the main one. Complex conjugates of these numbers are used to fill the diagonal just below the main one. The results for the other values of $\mu$ are used to fill the next diagonals, until D diagonals above the main one and D diagonals below the main one have been filled.

The resulting sparse system could be solved by using complex arithmetic by Gauss elimination in $O(N.D^2)$ complex operations. In the general case, however, matrix normalization is performed in the following steps;

1. Matrix symmetrization: The complex system matrix $[a_{ik}]$ is multiplied from the left on the matrix $[a^*_{ki}]$. D additional diagonals will all have small entries of the order of magnitude of those entries which were neglected in the main system. They are thus neglected. So in the resulting real symmetric matrix only 2D+1 diagonals are left.

2. Right-hand-side recomputation: The right-hand-side is multiplied on the matrix $[a^*_{ki}]$.

3. Matrix Regularization: Theoretically the matrix is always positive definite. However this property can vanish due to truncation errors in computations. Thus it is worthwhile to slightly change the main diagonal entries in order to provide positive definiteness of the system matrix. The maximum number of the main diagonal is multiplied by a small factor, $\epsilon$, and the result is added to all numbers on the main diagonal.

The above description of the general case has been included to illustrate how the device would work for a general window function. However, it is possible to choose a window function which simplifies the computation. An example of such a function is the gaussian window function, $$w(t) = \exp\left\{ -\left( (t-t_0) \times \frac{f_s}{\gamma} \right)^2 \right\} \quad t_0 = \frac{t_2+t_1}{2} \quad (15)$$

which the inventors use in the preferred embodiment. This is an advantageous choice for the window function because it has the minimal possible time-bandwidth product (if that product is defined as a product of the second moments of w(t) and W($\omega$)). Here $f_s$ is a sampling frequency, $\gamma$ is a parameter, which is chosen so that the practical support of w(t) is finite; for example, if $\gamma=f_s(t_2-t_1)/6$, then $w(t)\leq 0.0002$ for $t\leq t_1$ and $t\geq t_2$, while $w(t_0)=1$. The centre of the window function is denoted by $t_0$.

The Fourier transform of this window function is;

$$W(\omega) = \sqrt{\pi}\ \gamma \exp\left\{ \frac{-\gamma^2\omega^2}{4} \right\} \exp\{\omega t_0\} \quad (16)$$

The Fourier transforms $\Phi_k(\omega)$ of the basis functions $\Phi_k(t)$ are shifted gaussians.

When the number, N, of degrees of freedom for the filter increases, the number of gaussians $\Phi(\omega)$ on the frequency axis and their density increase as well. With the correct choice of parameters ($\gamma$ and $\Delta\omega$) the overlapping between gaussians is small. This means that $\Delta\omega$ must be of the order of 1/N and $\gamma$ must be of the order of N.

The set of parameters used in the embodiment is $\Delta\omega=2\pi f_s/N$ and $\gamma$ in the range from 0.25N to 0.75N. The optimal value for $\gamma$ has been found to be $\gamma=(15/32)N$. However other sets of parameters could be chosen.

With such a choice of parameters, only the diagonals which are neat the main diagonal in the matrix $[a_{ik}]$ will have significant values which need to be taken into account in the solution. Typically there are three non-zero diagonals from each side of the main one. The matrix is sparse and can be inverted in O(N) operations.

The general formula for the matrix coefficients $a_{ik}$ yields for a gaussian window function;

$$a_{ik} = C\exp\left\{ -\frac{\gamma^2}{8}(\Delta\omega)^2(i-k)^2 \right\} G_{xx}\left( \frac{i+k}{2}\Delta\omega \right) \quad (17)$$

$$G_{xx} = F\left[ R_{xx}(\tau)\exp\left\{ -\frac{1}{2}\left(\frac{\tau}{\gamma}\right)^2 \right\} \right]$$

and the formula for the right-hand-side coefficients $r_i$ yields for a gaussian window function;

$$r_i - G_{xy}(i\Delta\omega) \quad G_{xy}(\omega) = F\left[ R_{xy}(\tau)\exp\left\{ -\frac{(t-t_0)^2}{\gamma^2} \right\} \right] \quad (18)$$

where $C^{\gamma\pi/2}$.

The Fourier transforms are sampled in steps of $\Delta\omega$ in (19) or $\Delta\omega/2$ in (18).

In the case of the gaussian window the steps of matrix symmetrisation and right-hand-side recomputation are unnecessary, and so the calculation of the system matrix is much simpler. Calculation of the matrix $[a_{ik}]$ is based on equation 17 as follows;

The auto-correlation data, $R_{xy}$, in the range $-(L-1)$ to $L-1$ are multiplied by the sampled gaussian and padded by a zero to obtain 2L numbers. The data are ordered as in the general case. The data are transformed to the frequency domain using FFT. Due to the symmetry of the auto-correlation the result will be real.

The FFT result is decimated by two, yielding 2N real numbers: $F_0, F_1, \ldots, F_{2N-1}$, each of which corresponds to a certain value i+k and is placed on one of the 2N secondary diagonals of the matrix $[a_{ik}]$. The multiplication by another gaussian, $C\exp\{(-\alpha(i-k)^2\}$, $\alpha=(\gamma\Delta\omega)^2/8$, is actually performed along each of the secondary diagonals. For each of the principal diagonals, the value of |i−k| and the value of the gaussian multiplier are constant. The maximum of the gaussian is located on the main diagonal. Due to a practically finite support of the gaussian only a few diagonals are considered as non-zero.

The matrix is defined on a torus, with the right-hand-side connected to the left and the bottom to the top. For a gaussian window the matrix $[a_{ik}]$ is symmetric with purely real entries.

In equations 17 and 18 the FFTs can be used instead of F. The results should be decimated according to the desired step in the frequency domain. To achieve more accurate results a basic resolution of $\Delta\omega/4$ has been used for the FFTs and consequently a decimation by 4:1 in 17 and 2:1 in 18.

The convolver block utilizes the current filter coefficients and computes as its output the convolution of the reference signal, x, with the filter. For this purpose it is necessary to obtain the transversal form of the filter. The previous computation resulted in a set of weights. The transversal form of the filter may be obtained by computing the weighted sum of the basis functions with the recently computed weights. This step :may be carried out by using an IFFT followed by multiplication of the result with a sampled window function. Depending on whether the convolver works in the time domain or in the frequency domain it uses the computed impulse response or performs an additional FFT to get the filter frequency response, $Q(\omega)$.

In the preferred embodiment the time domain (the lag domain) is used and the signals (and their correlation functions) are sampled with a period $T=1/f_S$. Hence all expressions in the frequency domain get the form of a discrete Fourier transform (DFT) and the fast Fourier transform (FFT) could be efficiently used for actual computation. This yields the following general expression for the filter taps;:

$$q_n = q\left(\frac{n}{f_s}\right) = w\left(\frac{n}{f_s}\right) \sum_{k=-\frac{N}{2}}^{\frac{N}{2}-1} C_k \exp\left\{j\frac{2\pi nk}{N}\right\} = Nw_n c_n \quad (19)$$

$$\{C_n\} = IFFT\{C_k\}$$

In the preferred embodiment with a gaussian window function, the filter length, L, is chosen to be equal to 2N and a computation of the filter in the time domain is found by putting a zero between every two coefficients $C_k$ and performing a 2N-point IFFT in the equation for the filter taps, yielding the following expression for the filter taps;

$$q_n = q(n/f_s) = Nc_n \exp\{-(n/\gamma)^2\} \{c_n\} = IFFT\{C_k\} \quad (20)$$

The delay on the main microphone signal, y, with $t_0=0$ is equal to N taps (ha. If the filter length).

The equation solver block is activated every few frames and the system of N equations with N unknown coefficients $C_k$ is solved. The equation solver uses an appropriate one of the many existing variations of Gauss elimination to solve the system efficiently in O(N) operations.

In the case that the convolver uses the same signal frames as the correlation block, it may use FFTs of the reference x that have already been computed. The convolver can also use smaller signal frames, which, in order to minimize delay, is the case in the preferred embodiment. In that case the convolver should provide the computation FFTs of smaller signal frames. Also the filter impulse response should be split into several frames and the corresponding FFT calculated.

A filter has to be causal. Therefore in the case that $t_1<0$ the filter is shifted by $t_1/f_S$ taps. In the difference $z=y-Qx$, the main microphone signal, y should therefore be delayed as well.

The device includes a delay 80 for the main microphone signal, which balances any undesirable delay in the adaptive filter due either to incomplete causality of the filter or to delay in the convolver.

The control logic contains either short-time power or amplitude estimators for the reference and the subtractor output. The forgetting factor, $\alpha$, which is utilized in the correlation logic block 30, is set to a certain fixed function of the two control variables; the short-time estimation of the reference, $E^{(x)}$, and the short-time estimation of the subtractor output, $E^{(z)}$.

If the main speaker signal is much larger than the noise component in the main microphone output and $E^{(x)}/E^{(z)}$ is large, $\alpha$ should be set to 1, since past segments of the signal contain information relevant for the current filter adaptation. If the interfering noise signal is dominant and $E^{(x)}/E^{(z)}$ is small, the current signal behaviour bears more relevance on the filter adaptation than past signal behaviour, and so $\alpha$ is set to a value $0 \leq \alpha < 1$. This also provides a faster adaptation. Correspondingly $\alpha$ could be chosen to be a certain function of the ratio $E^{(x)}/E^{(z)}$. However if both $E^{(x)}$ and $E^{(z)}$ are estimated to be small (i.e. both the microphones are at low noise level) then the set $\alpha=1$ is preferable, since it freezes the filter components.

The adaptive filter is capable of fast adaptation because the adaptation time can be made as small as the filter length.

A conventional analog AGC block, which controls the main microphone output before A/D conversion could be used in the device without additional modifications, since the adaptation rate of the proposed noise cancellation device is sufficient to accommodate slow gain changes. A digital AGC can be used in cases for which an analog AGC at the main microphone is absent. This digital AGC block utilizes the average power or amplitude estimate of the subtractor output. Either a separate estimator could be used or the estimator in the control block could be utilized, possibly after additional low-pass (optionally non-linear) filtering. This non-linear filtering could provide for different time constants for rise-time and fall-time. The gain G is defined as a fixed positive function of the output E of the estimator. The larger E is, the smaller the gain G is, and vice versa. For small signals E≈0 the gain is limited by a certain constant $G_0$. The subtractor output is then multiplied by the gain to produce the output.

In addition logic can be provided that digitally performs signal compression and decompression; i.e. the incoming signal could be decompressed from a non-linear (usually logarithmic) form to a linear form and the outgoing signal could be compressed from a linear to a non- linear form.

Figure 2:
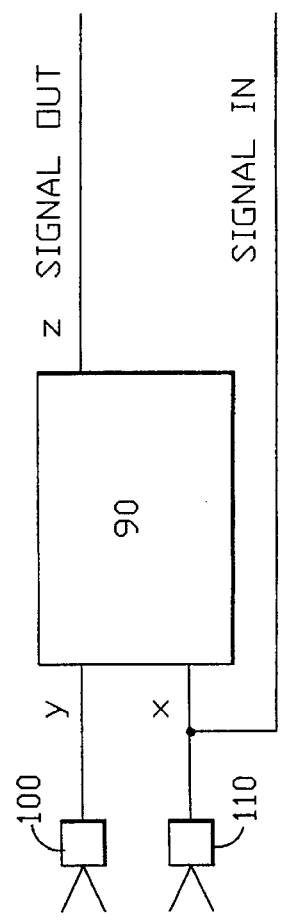
FIG. 2. is a schematic block diagram of a speakerphone which includes an adaptive noise cancellation device as a howling canceller.

The noise cancellation device can be used as an echo or howling canceller for a full duplex speakerphone. In this application the speaker phone is arranged as shown in FIG. 2 with the signal in from the remote telephone fed to loudspeaker 110 and in addition used as reference signal x. The signal from the microphone 100 is used as input signal y and the adaptive noise cancellation device 90 cancels any feedback signal from the loudspeaker to the microphone.

While there has been described and illustrated an adaptive noise cancellation device for use with microphones and loudspeakers, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. An adaptive noise cancellation device having a signal input (y), a reference input (x) and a signal output (z), the device comprising:

convolution logic (10) for convolving the signal from the reference input (x) with a discretised L-tap filter to form a filtered reference signal; and logic (20) for subtracting the filtered reference signal from the signal input to form the output signal;

logic for generating the filter taps as a linear combination of N basis functions each having a corresponding coefficient $C_k$; and logic for repeatedly determining the coefficients $C_k$ which minimize the power in the output signal (z), said N is less than the number of filter taps L and said N basis functions have respective values over a portion of finite width, outside of which portion the functions are substantially zero, both in the frequency and time domains wherein said N basis functions have the form:

$$W_k(t) = w(t) \exp\{jk(\Delta\omega)t\}$$

for N values of an integer k, where w(t) is a window function having a portion of finite width, outside of which portion the function is substantially zero, both in the frequency and time domains.

2. An adaptive noise cancellation device as claimed in claim 1 wherein the window function w(t) is a gaussian function.

3. An adaptive noise cancellation device as claimed in claim 1 wherein the window function has the form:

$$w(t) = \exp\{-(tf_s/\gamma)^2\}$$

with $\Delta\omega = 2\pi f_s/N$ and $\gamma$ in the range 0.25N to 0.75N.

4. Adaptive noise cancellation device as claimed in claim 1 wherein N is a number one half of said filter length L.

5. An adaptive noise cancellation device having a signal input (y), a reference input (x) and a signal output (z), the device comprising:

convolution logic (10) for convolving the signal from the reference input (x) with a discretised L-tap filter to form a filtered reference signal; and logic (20) for subtracting the filtered reference signal from the signal input to form the output signal;

logic for generating the filter taps as a linear combination of N basis functions each having a corresponding coefficient $C_k$; and logic for repeatedly determining the coefficients $C_k$ which minimize the power in the output signal (z), said N is less than the number of said filter taps L and said N basis functions have respective values over a portion of finite width, outside of which portion the functions are substantially zero, both in the frequency and time domains, wherein the logic for generating the filter response function comprises:

correlation logic (30) for generating the cross-correlation between said signal input (y) and said reference input (x) and for generating the autocorrelation of the reference input (x);

logic (40) for calculating the right hand side of a system of linear equations for the coefficients $C_k$ using the equation $$r_i = G_{xy}(i\Delta\omega)$$

where $G_{xy}(\omega)$ is the Fourier transform of product of the window function w(t) and the cross-correlation between said signal input (y) and said reference input (x); said logic (40) for calculating the coefficients of the system of linear equations using the equation, $$a_{ik} = G_{xx}\left(\frac{i+k}{2}\Delta\omega, \frac{i-k}{2}\right)$$

where $G_{xx}(\omega,\mu)$ is the Fourier transform of the product of the autocorrelation of the said reference input (x) and an auxiliary function $$k(t,\mu) = F^{-1}[W^*(\omega-\mu\Delta\omega)W(\omega+\mu\Delta\omega)]$$

where $W(\omega)$ is the Fourier transform of the window function w(t); and equation solving logic (50) for solving the equations $a_{ik}C_k = r_i$ for $C_k$.

6. An adaptive noise cancellation device as claimed in claim 5 wherein said correlation logic (30) comprises:

logic for segmenting said signal input (y) and said reference input (x) into frames of a length equal to the filter length L;

logic for generating a Fourier transform of the frames; logic for combining the Fourier transforms of the frames with a current segment of the auto-correlation function and cross-correlation functions weighted by a factor $\alpha$, where $\alpha$ is between 0 and 1, to form an updated segment of the cross-correlation and auto-correlation functions.

7. An adaptive noise cancellation device as claimed in claim 6 comprising control logic (60) for calculating the factor $\alpha$ as an increasing function of the ratio of the power or amplitude of said reference input (x) and said signal output (z).

8. A speakerphone capable of full-duplex operation having a signal input and a signal output (z) comprising:

an adaptive noise cancellation device (90);

a microphone (100) arranged to provide the signal input (y) to said adaptive noise cancellation device;

and a loudspeaker (110) connected to said signal input of the speakerphone, wherein said signal input of said speakerphone provides said reference input (x) for said adaptive noise cancellation device and said signal output (z) of said adaptive noise cancellation device provides said signal output (z) of said speakerphone;

said adaptive noise cancellation device including:

convolution logic (10) for convolving the signal from the reference input (x) with a discretised L-tap filter to form a filtered reference signal; and logic (20) for subtracting the filtered reference signal from the signal input to form the output signal;

logic for generating the filter taps as a linear combination of N basis functions each having a corresponding coefficient $C_k$; and logic for repeatedly determining the coefficients $C_k$ which minimize the power in the output signal (z), Said N is less than the number of said filter taps L and said N basis functions have respective values over a portion of finite width, outside of which portion the functions are substantially zero, both in the frequency and time domains, wherein said N basis functions have the form:

$$W_k(t) = w(t) \exp\{jk(\Delta\omega)t\}$$

for N values of an integer k, where w(t) is a window function having a portion of finite width, outside of which portion the function is substantially zero, both in the frequency and time domains.

9. A method for adaptive noise cancellation of noise in a signal input (y) by using a reference input (x) to provide a signal output (z), comprising the steps of:

convolving the signal from the reference input (x) with a discretised L-tap filter to form a filtered reference signal; and subtracting the filtered reference signal from the signal input to form said output signal (z);

generating the filter taps as a linear combination of N basis functions each having a corresponding coefficient $C_k$; and repeatedly determining the coefficients $C_k$ which minimize the power in said output signal (z), wherein said N is less than the number of said filter taps L and said N basis functions have respective value over a portion of finite width, outside of which portion the functions are substantially zero, both in the frequency and time domains, wherein said N basis functions have the form:

$$W_k(t) = w(t) \exp\{jk(\Delta\omega) t\}$$

for N values of an integer k, where w(t) is a window function having a portion of finite width, outside of which portion the function is substantially zero, both in the frequency and time domains.

10. The method of claim 9 wherein said window function w(t) is a gaussian function.

11. The method of claim 10 wherein said window function has the form:

$$w(t) = \exp\{-(tf_s/\gamma)^2\}$$

with $\Delta\omega = 2\pi f_s/N$ and $\gamma$ in the range 0.25N to 0.75.

12. A method for adaptive noise cancellation of noise in a signal input (y) by using a reference input (x) to provide a signal output (z), comprising the steps of:

convolving the signal from the reference input (x) with a discretised L-tap filter to form a filtered reference signal; and subtracting the filtered reference signal from the signal input to form said output signal (z);

generating the filter taps as a linear combination of N basis functions each having a corresponding coefficient $C_k$; and repeatedly determining the coefficients $C_k$ which minimize the power in said output signal (z), wherein said N is less than the number of said filter taps L and said N basis functions have respective value over a portion of finite width, outside of which portion the functions are substantially zero, both in the frequency and time domains, wherein said step of generating the filter taps includes the steps of:

generating the cross-correlation between said signal input (y) and said reference input (x) and generating the autocorrelation of the reference input (x);

calculating the right hand side of a system of linear equations for the coefficients $C_k$ using the equation $$r_i = G_{xy}(i\Delta\omega),$$

where $G_{xy}(\omega)$ is the Fourier transform of product of the window function w(t) and the cross-correlation between said signal input (y) and said reference input (x); said step of calculating the coefficients of the system of linear equations including using the equation, $$a_{ik} = G_{xx}\left(\frac{i+k}{2} \Delta\omega, \frac{i-k}{2}\right)$$

where $G_{xx}(\omega,\mu)$ is the Fourier transform of the product of the autocorrelation of the said reference input (x) and an auxiliary function $$k(t, \mu) = F^{-1}[W^*(\omega-\mu\Delta\omega)W(\omega+\mu\Delta\omega)]$$

where $W(\omega)$ is the Fourier transform of the window function w(t); and solving the equations $a_{ik}C_k = r_i$ for $C_k$.

13. The method of claim 12 wherein said step of generating the cross-correlation includes the step of:

segmenting said signal input (y) and said reference input (x) into frames of a length equal to the filter length L;

generating a Fourier transform of the frames; logic for combining the Fourier transforms of the frames with a current segment of the auto-correlation function and cross-correlation functions weighted by a factor $\alpha$, where $\alpha$ is between 0 and 1, to form an updated segment of the cross-correlation and auto-correlation functions.

14. The method of in claim 13 further including the step of calculating the factor $\alpha$ as an increasing function of the ratio of the power or amplitude of said reference input (x) and said signal output (z).

15. A method for adaptive noise cancellation of noise in a signal input (y) by using a reference input (x) to provide a signal output (z), comprising the steps of:

convolving the signal from the reference input (x) with a discretised L-tap filter to form a filtered reference signal; and subtracting the filtered reference signal from the signal input to form said output signal (z);

generating the filter taps as a linear combination of N basis functions each having a corresponding coefficient $C_k$; and repeatedly determining the coefficients $C_k$ which minimize the power in said output signal (z), wherein said N is less than the number of said filter taps L 14 and said N basis functions have respective value over a portion of finite width, outside of which portion the functions are substantially zero, both in the frequency and time domains, wherein N is selected to be a number one half of said filter length L.

* * * * *